United States Patent [19]
Fujii

[11] Patent Number: 5,175,448
[45] Date of Patent: Dec. 29, 1992

[54] BOOSTER CIRCUIT
[75] Inventor: Takeo Fujii, Tokyo, Japan
[73] Assignee: NEC Corporation, Tokyo, Japan
[21] Appl. No.: 678,215
[22] Filed: Apr. 1, 1991
[30] Foreign Application Priority Data Mar. 30, 1990 [JP] Japan .................................. 2-84046

[51] Int. Cl.$^5$ ............................................. H03K 19/01
[52] U.S. Cl. .................................... 307/482; 307/480;
307/453; 307/496
[58] Field of Search .............. 307/480, 482, 453, 496,
307/480, 482, 453, 496

[56]  References Cited
U.S. PATENT DOCUMENTS

| | | | |
|---|---|---|---|
| 4,639,622 | 1/1987 | Goodwin | 307/482 |
| 4,689,505 | 8/1987 | Ghoshal | 307/482 |
| 4,751,407 | 6/1988 | Powell | 307/480 |
| 4,937,476 | 6/1990 | Bazes | 307/482 |

Primary Examiner—Eugene R. LaRoche
Assistant Examiner—R. Ratliff
Attorney, Agent, or Firm—Leydig, Voit & Mayer

[57] ABSTRACT

A booster circuit comprises a p-MOS transistor, two n-MOS transistors and a bootstrap capacitor. In the booster circuit, an output signal is charged up to a potential of a power supply through the n-MOS transistors, then is pushed up to a potential higher than that of the power supply by a bootstrap capacitor through the p-MOS transistors. In such a structure, the p-MOS transistor operates as a switching element when pushing up the output signal, so that operation speed is much higher than a conventional booster circuit in which n-MOS transistors are used as switching elements.

3 Claims, 5 Drawing Sheets

BOOSTER CIRCUIT

FIELD OF THE INVENTION

This invention relates to a booster circuit, and more particularly to, a booster circuit used in a semiconductor circuit for obtaining a potential higher than that of a power supply.

BACKGROUND OF THE INVENTION

In a semiconductor circuit such as a semiconductor memory circuit, a potential higher than that supplied from a power supply is sometimes required for a purpose of realizing high speed operation or obtaining a predetermined level of reading or writing signals, so that various kind of booster circuits for boosting a potential have been used in such a semiconductor circuit. Such a conventional booster circuit comprises combinations of n-MOS transistors which are used as switching elements and bootstrap capacitors.

A first conventional booster circuit comprises a clock generator which generates a clock signal to be boosted, several n-MOS transistors and bootstrap capacitors. In the booster circuit, the clock signal supplied by the clock generator is "0" in an initial state, then is charged up to "$V_{CC}$" which is a potential of a power supply, and finally is pushed up to "$V_{DD}$" which is a potential higher than "$V_{CC}$" by charged bootstrap capacitors through an n-MOS transistor.

A second conventional booster circuit comprises a clock generator which generates a control clock signal which has a potential level equal to or higher than that of a power supply, several n-MOS transistors, bootstrap capacitors and a delay circuit. In the booster circuit, a current flows through the n-MOS transistors to accumulate charges into a bootstrap capacitor, and an output signal is charged up to "$V_{CC}$", then finally the output signal is pushed up to "$V_{DD}$" by the bootstrap capacitor storing the charges.

According to the conventional booster circuits, however, there are several disadvantages as described after. First, operation speed is not fast, because n-MOS transistors which are not fast in switching speed are used as switching elements. Second, a very high voltage is applied to a gate of an n-MOS transistor. This not preferably for the booster circuits in light of its reliability. Third, the booster circuits comprise many elements such as transistors, so that fabricating cost may be large. And finally, many bootstrap capacitors are required to be controlled, so that an error of operation may occur by skew of signals in the booster circuits.

SUMMARY OF THE INVENTION

Accordingly, it is an object of the invention to provide a booster circuit in which operation speed is much improved.

It is a further object of the invention to provide a booster circuit which has high reliability.

It is a still further object of the invention to provide a booster circuit in which operation errors are reduced.

According to a feature of the invention, a booster circuit comprises:

means for generating a first control signal, the first control signal selectively having first and second levels, the first level being higher by a predetermined value than a potential of a power supply and the second level being a level not exceeding the potential of the power supply;

a first n-MOS transistor which is connected at a gate to an output terminal of the generating means by which the gate is supplied with the first control signal, at one channel terminal to the power supply, and at the other channel terminal to a first connecting point;

a p-MOS transistor which is connected at a gate to an input terminal which is supplied with an input signal, at one of channel terminal to the first connecting point, and at the other channel terminal to an output terminal by which an output signal of the booster circuit is supplied to an external circuit;

a second n-MOS transistor which is connected at a gate to the input terminal, at one channel terminal to the output terminal, and at the other channel terminal to ground; and a capacitor which is connected at one terminal to the first connecting point and at the other terminal to a control terminal by which the capacitor is supplied with a second control signal;

wherein the p-MOS transistor is formed on a surface of an n-type well region in which no other p-MOS transistor is formed, a potential of the n-type well being controlled to have the same level as that of the first connecting point; and the generating means is controlled to generate the first signal of the first level in a normal state, and of the second level in a predetermined period including at least a duration during which the second control signal is high.

BRIEF DESCRIPTION OF THE DRAWINGS

The invention will be described in more detail in conjunction with appended drawings, wherein.

DESCRIPTION OF THE PREFERRED EMBODIMENTS

Before describing a booster circuit according to the invention, the conventional booster circuits briefly described before will be explained in conjunction with FIGS. 1 to 5.

Figure 1:
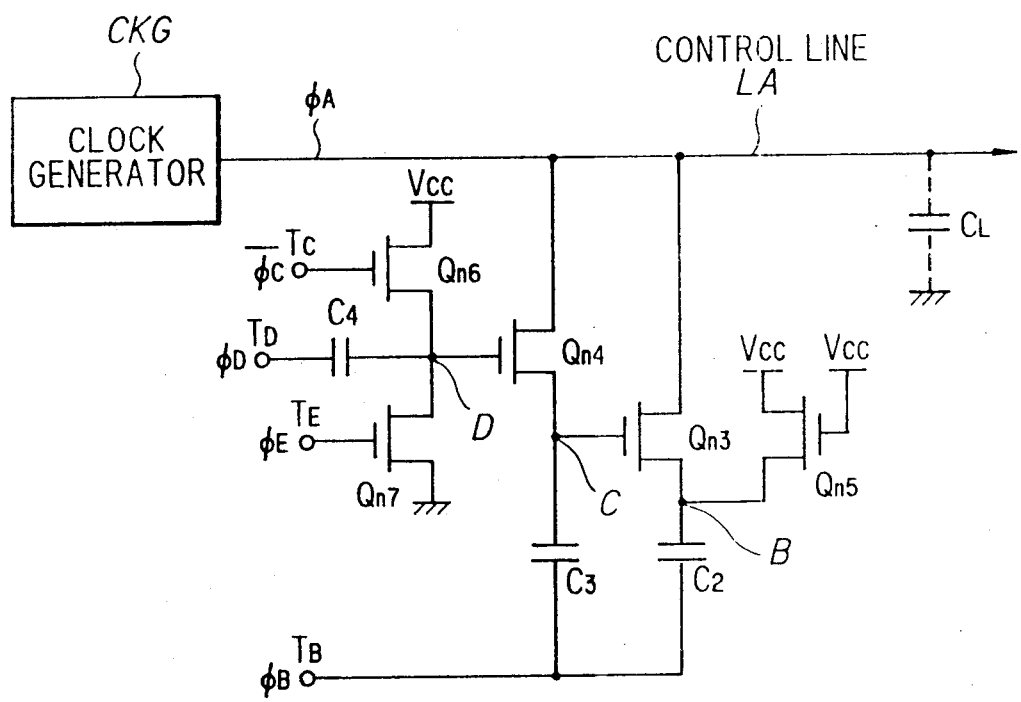
FIG. 1 is a circuitry diagram showing the first conventional booster circuit.

The first conventional booster circuit is shown in FIG. 1, wherein it comprises a clock generator CKG which generates a clock signal $\phi_A$ which is a signal to be boosted, n-MOS transistors $Q_{n3}$ to $Q_{n7}$, and bootstrap capacitors $C_2$ to $C_4$. The clock generator CKG controls a control line LA to become a floating state after supplying the clock signal $\phi_A$ thereto. There exists a load capacitor $C_L$ in the control line LA. The n-MOS transistor $Q_{n3}$ is connected at a gate to a connecting point C, at a source to a connecting point B, and at a drain to the control line LA. The n-MOS transistor $Q_{n4}$ is connected at a gate to a connecting point D, at a source to the connecting point C, and at a drain to the control line LA. The n-MOS transistor $Q_{n5}$ is connected at a gate and a drain to a power supply of a potential $V_{CC}$, and at a source to the connecting point B. The n-MOS transistor $Q_{n6}$ is connected at a gate to a terminal $T_C$ which is applied with a control clock signal $\phi_C$, at a source to the power supply of the potential $V_{CC}$, and at a drain to the connecting point D. The n-MOS transistor $Q_{n7}$ is connected at a gate to a terminal $T_E$ which is applied with a control clock signal $\phi_E$, at a source to the connecting point D, and at a drain to ground. The bootstrap capacitor $C_2$ is connected at one terminal to the connecting point B and at the other terminal to a terminal $T_B$ which is supplied with a control clock signal $\phi_B$. The bootstrap capacitor $C_3$ is connected at one terminal to the connecting point C and at the other terminal to the terminal $T_B$. The bootstrap capacitor $C_4$ is connected at one terminal to the connecting point D and the other terminal to a terminal $T_D$ which is applied with a control clock signal $\phi_D$.

Figure 2:
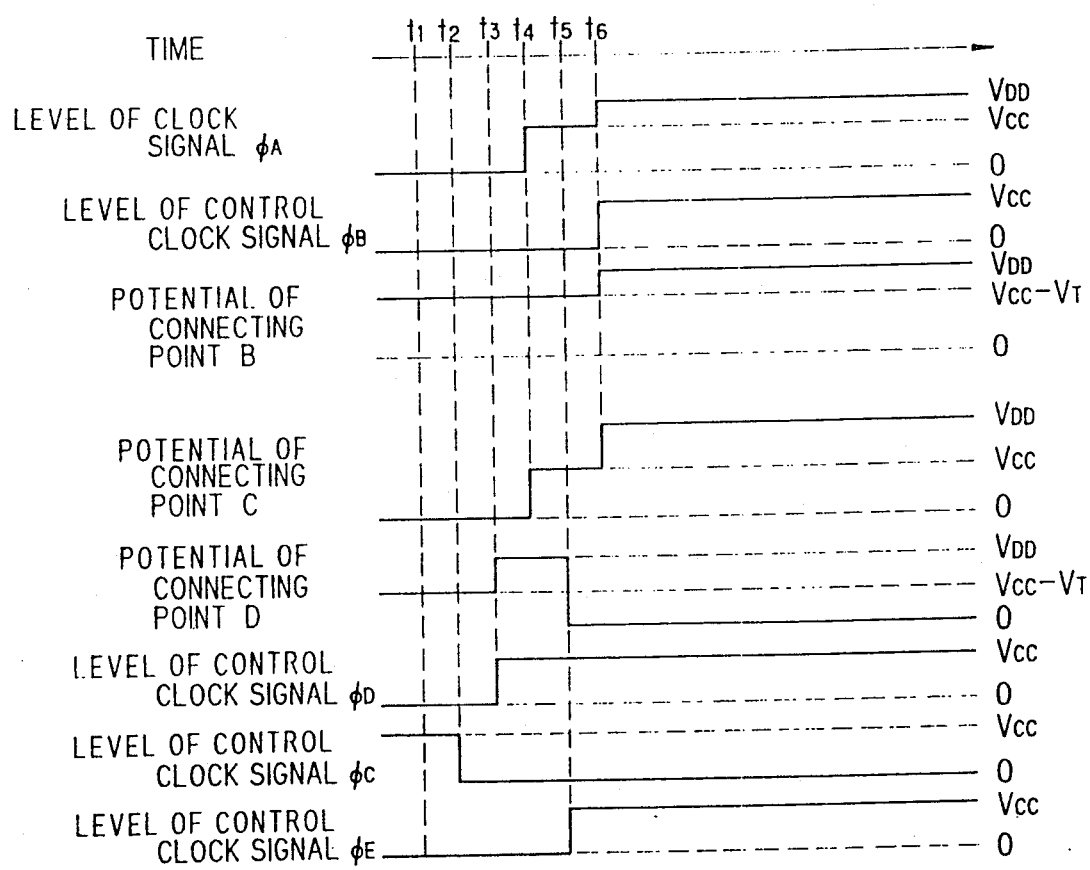
FIG. 2 is a timing chart showing operation in the first conventional booster circuit.

Operation of the first conventional booster circuit will be explained in conjunction with FIG. 2.

At the time $t_1$, the clock signal $\phi_A$ is "0", control clock signals $\phi_B$, $\phi_D$, $\phi_E$ are all "0", and a control clock signal $\phi_C$ which is an inverted signal of a low active signal $\overline{\phi_C}$ is "$V_{CC}$". On this condition, the n-MOS transistor $Q_{n6}$ is at "ON" (conductive) state as the control clock signal $\phi_C$ is "high", and the n-MOS transistor $Q_{n7}$ is at "OFF" (non-conductive) state as the control clock signal $\phi_E$ is "low", so that a potential of the connecting point D is charged up to "$V_{CC}-V_T$", where the voltage $V_T$ is a threshold voltage of the n-MOS transistors hereinafter. On the other hand, the n-MOS transistor $Q_{n4}$ is at "OFF" state as a potential of the gate thereof is not high enough, so that the connecting point C remains at a floating state. Therefore, the state of the n-MOS transistor $Q_{n3}$ depends on a potential of the connecting point C connected to the gate. On the other hand, the n-MOS transistor $Q_{n5}$ is always "ON" state as the gate is connected to the power supply, so that a potential of the connecting point B depends on the state of the n-MOS transistor $Q_{n3}$.

A the time $t_2$, the control clock signal $\phi_C$ becomes "0", so that the n-MOS transistor $Q_{n6}$ becomes "OFF" state. As a result, the connecting point D becomes a floating state. When the control clock signal $\phi_D$ becomes "$V_{CC}$" at the time $t_3$, a potential of the connecting point D is pushed up to "$V_{DD}$" which is a potential higher than the potential $V_{CC}$ of the power supply by the bootstrap capacitor $C_4$. At this time, the n-MOS transistor $Q_{n4}$ becomes "ON" state as a potential of the gate is high enough, so that a potential of the connecting point C becomes "0" which is equal to that of the clock signal $\phi_A$. As a result, the n-MOS transistor $Q_{n3}$ becomes "OFF" state, so that a potential of the connecting point B is charged up to "$V_{CC}-V_T$".

At the time $t_4$, the clock generator CKG becomes active to make the clock signal $\phi_A$ equal to "$V_{CC}$", so that a potential of the connecting point C becomes "$V_{CC}-V_T$", and the bootstrap capacitor $C_3$ is charged through the n-MOS transistor $Q_{n4}$ which is "ON" state from the control line LA. The load capacity $C_L$ is also charged.

When the control clock signal $\phi_E$ becomes "$V_{CC}$" at the time $t_5$, the n-MOS transistor $Q_{n7}$ becomes "ON" state, so that the connecting point D is connected to ground to become "0". As a result, the n-MOS transistor $Q_{n4}$ becomes "OFF" state, so that the connecting point C becomes a floating state to remain the potential "$V_{CC}-V_T$". At the same time, a transistor (not shown in FIG. 1) which drives the clock signal $\phi_A$ in the clock generator CKG becomes "OFF" state, so that the control line LA becomes a floating state.

When the control clock signal $\phi_B$ becomes "$V_{CC}$" at the time $t_6$, potentials of the connecting points B and C are pushed up to "$V_{DD}$" by the bootstrap capacitors $C_2$ and $C_3$, respectively. When a potential of the connecting point C becomes higher by the threshold voltage $V_T$ than that of the clock signal $\phi_A$, the n-MOS transistor $Q_{n3}$ becomes "ON" state, so that the clock signal $\phi_A$ is pushed up to "$V_{DD}$" by the bootstrap capacitor $C_2$ through the n-MOS transistor $Q_{n3}$.

In the first conventional booster circuit, a potential of the connecting point C is a critical factor for increasing boosting operation of the booster circuit, that is a boosting speed of the clock signal $\phi_A$ from a potential of ground to a potential higher than that of the power supply, because the n-MOS transistor $Q_{n3}$ which operates as a driving transistor in the booster circuit is controlled by the gate potential, that is a potential of the connecting point C.

As described before, at the time $t_6$ when the control clock signal $\phi_B$ becomes "high", a potential of the source of the n-MOS transistor $Q_{n3}$, that is a potential of the connecting point B, has already become a vicinity of the potential of the power supply, in other words, the substantial bias of the substrate of the semiconductor chip on which the semiconductor circuits including the booster circuit are formed is very high, so that the threshold voltage of the n-MOS transistor $Q_{n3}$ has become higher than usual. As a result, operation speed of boosting of the booster circuit may become very slow or even the booster circuit cannot carry out the boosting operation substantially, unless the potential of the connecting point becomes considerably high.

On the other hand, if periods, such as a period during which the connecting point C is charged up from a potential of ground to that of the power supply through the n-MOS transistor $Q_{n4}$, the period between the time when a potential of the connecting point D becomes "0" and the time when the control clock signal $\phi_B$ becomes "$V_{CC}$", etc., are set to be relatively short in order to increase the operation speed, shortage of a level of the clock signal $\phi_A$ may occur because of fluctuation of conditions in the fabrication process of the booster circuit or deviation of the circuitry layout, so that the operation may become unstable. Thus, an existence of a connecting point like C where a potential changes from a potential of ground to a potential higher than that of the power supply may cause decrease of operation speed and an error of operation.

Figure 3:
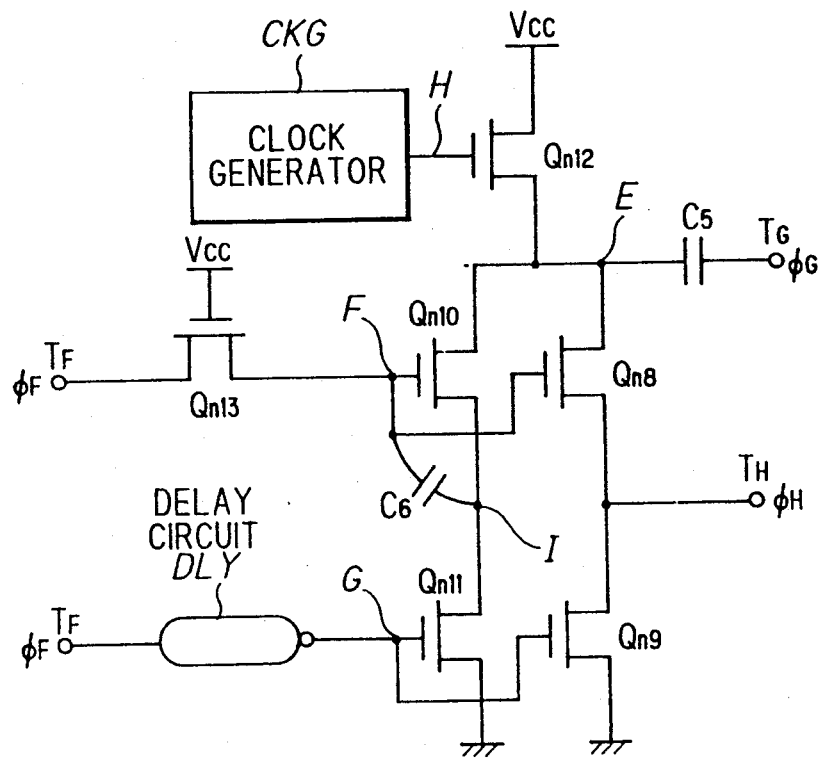
FIG. 3 is a circuitry diagram showing the second conventional booster circuit.

Next, the second conventional booster circuit is shown in FIG. 3, wherein it comprises a clock generator CKG which generates a voltage equal to or higher than that of a power supply, n-MOS transistors $Q_{n8}$ to $Q_{n13}$, bootstrap capacitors $C_5$ and $C_6$, and a delay circuit DLY.

The n-MOS transistor $Q_{n8}$ is connected at a gate to a connecting point F, at a source to a terminal $T_H$ from which an output clock signal $\phi_H$ is supplied to an external circuit as an output signal, and at a drain to a connecting point E. The n-MOS transistor $Q_{n9}$ is connected at a gate to a connecting point G, at a source to ground, and at a drain to the terminal $T_H$. The n-MOS transistor $Q_{n10}$ is connected at a gate to the connecting point F, at a source to a connecting point I, and at a drain to a connecting point E. The n-MOS transistor $Q_{n11}$ is connected at a gate to the connecting point G, at a source to ground, and at a drain to the connecting point I. The n-MOS transistor $Q_{n12}$ is connected at a gate to an output terminal of the clock generator CKG, at a source to the connecting point E, and at a drain to a power supply of a potential "$V_{CC}$". The n-MOS transistor $Q_{n13}$ is connected at a gate to the power supply of the potential "$V_{CC}$", at a source to the connecting point F, and at a drain to a terminal $T_F$ which is applied with an input clock signal $\phi_F$. The bootstrap capacitor $C_5$ is connected at one terminal to the connecting point E and at the other terminal to a terminal $T_G$ which is applied with a control clock signal $\phi_G$. The bootstrap capacitor $C_6$ is connected at one terminal to the connecting point F and at the other terminal to the connecting point I. The delay circuit DLY is supplied with an input clock signal $\phi_F$ and supplies a delayed and inverted signal of the input clock signal $\phi_F$ to the connecting point G.

Figure 4:
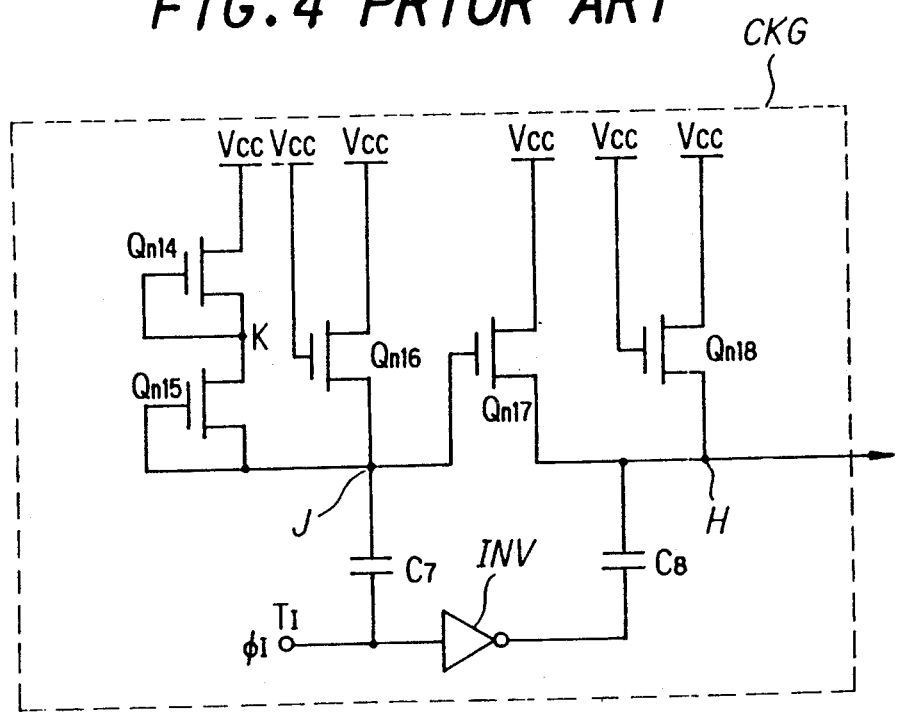
FIG. 4 is a circuitry diagram showing a clock generator in FIG. 3.

FIG. 4 shows a circuitry diagram of the clock generator CKG in FIG. 3, wherein it comprises n-MOS transistors $Q_{n14}$ to $Q_{n18}$, capacitors $C_7$ and $C_8$, and an inverter INV. The n-MOS transistor $Q_{n14}$ is connected at a gate and a source to a connecting point K, and at a drain to the power supply of the potential "$V_{CC}$". The n-MOS transistor $Q_{n15}$ is connected at a gate and a source to a connecting point J, and at a drain to the connecting point K. The n-MOS transistor $Q_{n16}$ is connected at a gate to the power supply of the potential "$V_{CC}$", at a source to the connecting point J, and at a drain to the power supply of the potential "$V_{CC}$". The n-MOS transistor $Q_{n17}$ is connected at a gate to the connecting point J, at a source to a connecting point H, and at a drain to the power supply of the potential "$V_{CC}$". The n-MOS transistor $Q_{n18}$ is connected at a gate to the power supply of the potential "$V_{CC}$", at a source to the connecting point H, and at a drain to the power supply of the potential "$V_{CC}$". The n-MOS transistors $Q_{n14}$ and $Q_{n15}$ are provided for preventing a potential of the connecting point J from becoming higher than "$V_{CC}-2V_T$", and the n-MOS transistors $Q_{n16}$ and $Q_{n18}$ are provided for preventing potentials of the connecting points J and H from becoming lower than "$V_{CC}-V_T$". The capacitor $C_7$ is connected at one terminal to the connecting point J and at the other terminal to a terminal $T_J$ which is applied with a control clock signal $\phi_I$. The capacitor $C_8$ is connected at one terminal to the connecting point H and at the other terminal to the output terminal of the inverter INV. The inverter INV supplies an inverted signal of the control clock signal $\phi_I$ to the capacitor $C_8$. In such a structure, when the control clock signal $\phi_I$ is "high", the connecting point J has a potential higher than "$V_{CC}$", so that a potential of the connecting point H becomes "$V_{CC}$" by the n-MOS transistor $Q_{n17}$. On the other hand, when the control clock signal $\phi_I$ is "low", the connecting point J has the potential "$V_{CC}$", so that a potential of the connecting point H becomes "$V_{DD}$" which is higher than "$V_{CC}$".

Figure 5:
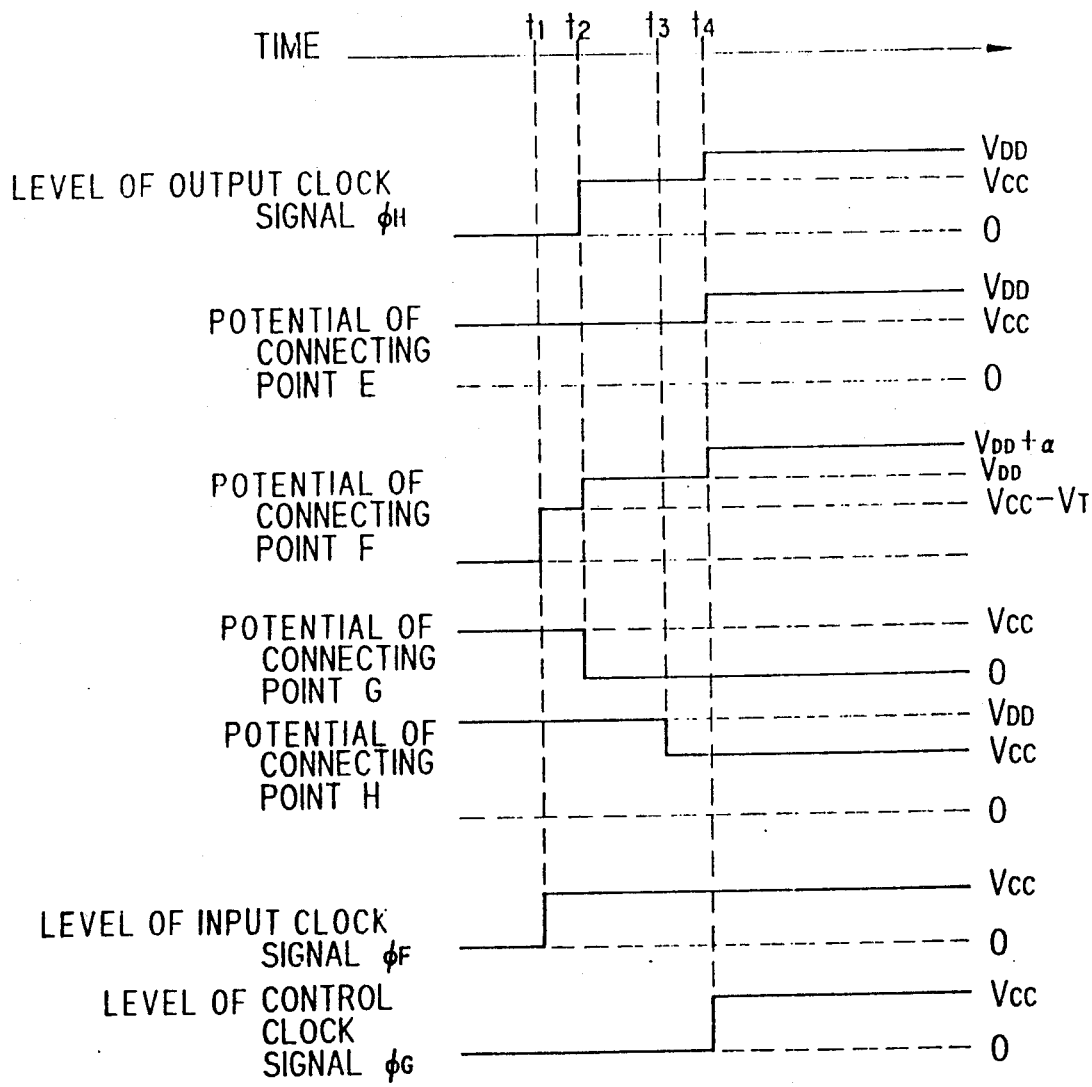
FIG. 5 is a timing chart showing operation in the second conventional booster circuit.

Operation of the second conventional booster circuit will be explained in conjunction with FIG. 5. At an initial state, the clock generator CKG supplies the potential "$V_{DD}$" which is higher than "$V_{CC}$" to the connecting point H, and the clock signals $\phi_F$ and $\phi_G$ are "0". On such a condition, the n-MOS transistor $Q_{n12}$ is "ON" state. A potential of the connecting point F is "0" as the input clock signal $\phi_F$ is "0" and the n-MOS transistor $Q_{n13}$ is "ON" state, so that the n-MOS transistors $Q_{n8}$ and $Q_{n10}$ are "OFF" state. As a result, a potential of the connecting point E is charged up to the potential "$V_{CC}$" through the n-MOS transistor $Q_{n12}$. On the other hand, the connecting point G is "$V_{CC}$" as the delay circuit DLY supplies thereto with an inverted level of the input clock signal $\phi_F$, so that the n-MOS transistors $Q_{n9}$ and $Q_{n11}$ become "ON" state. As a result, potentials of the connecting point I and the terminal $T_H$ remain "0", so that the output clock signal $\phi_H$ is "0".

When the input clock signal $\phi_F$ becomes "$V_{CC}$" at the time $t_1$, a potential of the connecting point F becomes "$V_{CC}$", however, the delay circuit DLY continues supplying the level "0" until the time $t_2$, so that a potential of the connecting point remains "0" between the times $t_1$ and $t_2$. As a result, all of the n-MOS transistors $Q_{n8}$ to $Q_{n11}$ remain in "ON" state between the times $t_1$ and $t_2$. In such a case, potentials of the connecting point I and the output clock signal $\phi_H$ may increase, however, they are prevented from becoming higher than the threshold voltage "$V_T$" of the n-MOS transistors by providing predetermined size ratios between the n-MOS transistors $Q_{n8}$ and $Q_{n9}$, and between the n-MOS transistors $Q_{n10}$ and $Q_{n11}$. Therefore, the bootstrap capacitor $C_6$ is charged up during the period shown above.

Then, a potential of the connecting point G becomes "0" at the time $t_2$, so that the n-MOS transistors $Q_{n9}$ and $Q_{n11}$ become "OFF" state. As a result, potentials of the connecting point I and the output clock signal $\phi_H$ begin ascending. At the same time, the n-MOS transistor $Q_{n13}$ becomes "OFF" state, so that a potential of the connecting point F is pushed up to "$V_{DD}$" which is higher than "$V_{CC}$" by the bootstrap capacitor $C_6$. As a result, the clock signal $\phi_H$ ascends to be "$V_{CC}$".

At the time $t_3$, the clock generator CKG supplies the potential "$V_{dd}$" which is higher than "$V_{CC}$" to the connecting point H. Then, the control clock signal $\phi_G$ becomes "$V_{CC}$", so that a potential of the connecting point E becomes "$V_{DD}$" by the bootstrap capacitor $C_5$. On the other hand, a potential of the connecting point F becomes "$V_{DD}+\alpha$" which is much higher than "$V_{CC}$" by gate capacities of the n-MOS transistors $Q_{n8}$ and $Q_{n10}$. As a result, the clock signal $\phi_H$ becomes "$V_{DD}$".

In the second conventional booster circuit, periods such as a charging up time of the connecting point F, that is the period between the time when all the transistors become "ON" state and the time when a potential of the connecting point becomes "low" to make the n-MOS transistor "OFF" state, are critical factors. However, the most critical problem of the second conventional booster circuit is that all of the transistors $Q_{n8}$ to $Q_{n11}$ become "ON" state simultaneously through which a current flows. In such a case, if the time $t_2$ when a potential of the connecting point G becomes "low" to make the n-MOS transistors "OFF" state, the time $t_3$ when a potential of the connecting point H becomes "$V_{CC}$", and the time $t_4$ when the control clock signal $\phi_G$ becomes "high" are improperly set, charges stored in the bootstrap capacitor $C_5$ is charged to ground without being used effectively for boosting the output clock signal $\phi_H$. As a result, a potential of the output clock signal $\phi_H$ may not be high enough, so that instability of operation may occur in the booster circuit.

Figure 6:
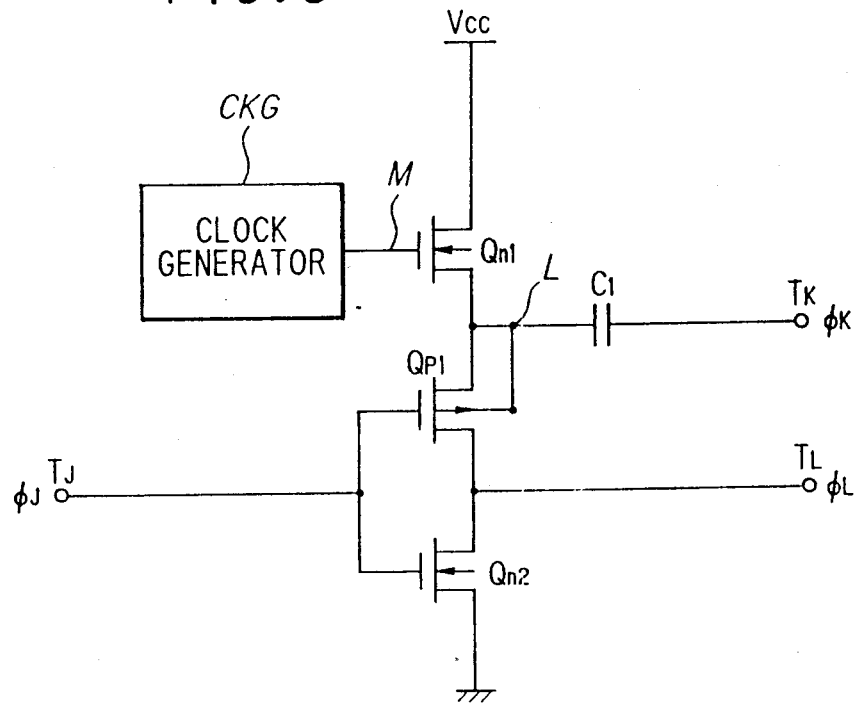
FIG. 6 is a circuitry diagram showing a booster circuit in a preferred embodiment according to the invention.

Next, a booster circuit in the preferred embodiment according to the invention will be explained in FIG. 6, wherein it comprises a clock generator CKG which generates a potential equal to or higher than that of a power supply, n-MOS transistors $Q_{n1}$ and $Q_{n2}$, a p-MOS transistor $Q_{p1}$, and a bootstrap capacitor $C_1$.

The clock generator CKG is the same as described in FIG. 4. The n-MOS transistor $Q_{n1}$ is connected at a gate to a connecting point M, at a source to a connecting point L, and at a drain to a power supply of a potential "$V_{CC}$". The n-MOS transistor $Q_{n2}$ is connected at a gate to a terminal $T_J$ to which an input clock signal $\phi_J$ is supplied, at a source to ground, and at a drain to a terminal $T_L$ from which an output clock signal $\phi_L$ is supplied to an external circuit. The p-MOS transistor $Q_{p1}$ is connected at a gate to the terminal $T_J$, at a source to the terminal $T_L$, and at a drain to the connecting point L. The p-MOS transistor $Q_{p1}$ is formed on an independent n-well region in which no other p-MOS transistor is formed in the same semiconductor chip, and the n-well region is connected to the connecting point L.

Figure 7:
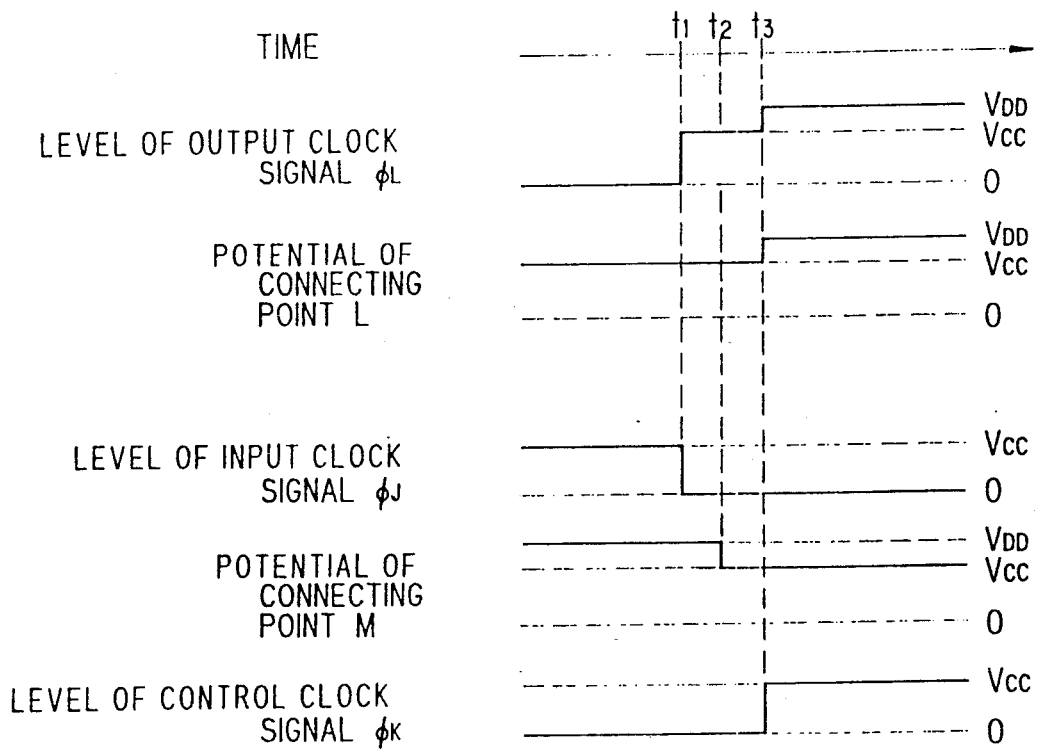
FIG. 7 is a timing chart showing operation in the booster circuit in the preferred embodiment according to the invention.

Operation of the booster circuit will be explained in conjunction with FIG. 7. At an initial state, the clock generator CKG supplies the potential "$V_{DD}$" which is higher than "$V_{CC}$" to the connecting point M. The input clock signal $\phi_J$ is "$V_{CC}$", while the control clock signal $\phi_k$ is "0". On such a condition, the n-MOS transistors $Q_{n1}$ and $Q_{n2}$ are "ON" state, while the p-MOS transistor $Q_{p1}$ is "OFF" state. As a result, a potential of the connecting point L is charged up to the potential "$V_{CC}$" through the n-MOS transistor $Q_{n1}$, while the output clock signal $\phi_L$ is "0".

When the input clock signal $\phi_J$ becomes "0" at the time $t_1$, the p-MOS transistor $Q_{p1}$ becomes "ON" state, while the n-MOS transistor $Q_{n2}$ becomes "OFF" state, so that the output clock signal $\phi_L$ is charged up to "$V_{CC}$" through the p-MOS transistor $Q_{p1}$.

At the time $t_2$, the clock generator CKG supplies the potential "$V_{CC}$". Then, the control clock signal $\phi_K$ becomes "$V_{CC}$" at the time $t_3$, so that a potential of the connecting point L is pushed up to "$V_{DD}$" which is higher than "$V_{CC}$" by the bootstrap capacitor $C_1$. As a result, the output clock signal $\phi_L$ is also pushed up to "$V_{DD}$" through the p-MOS transistor $Q_{p1}$ which is "ON" state.

In the booster circuit, the ascending speed of the gate potential of the n-MOS transistor $Q_{n1}$, which is an important factor for the charging up speed of the clock signal $\phi_L$ at the first stage from the ground potential to the vicinity of the power supply voltage, is not required to be fast, so that the operation speed characteristic of the n-MOS transistor $Q_{n1}$ does not affect operation speed of the booster circuit. As a result, the operation speed of the booster circuit is much improved.

The output clock signal $\phi_L$ is pushed up to a potential higher than the power supply potential through a p-MOS transistor which becomes "ON" state when the gate potential thereof is "low" in place of an n-MOS transistor which becomes "ON" state when the gate potential thereof is "high", so that it is prevented that a gate of a driving transistor, that is the p-MOS transistor $Q_{p1}$ in the preferred embodiment, is not applied with a considerably high potential. As a result, a reliability of the booster circuit is much improved.

There is no connecting point where a potential ascends from the ground potential to a potential higher than that of the power supply or a potential descends from a potential higher than that of the power supply to the ground potential in a short time as is in the conventional booster circuits described before, so that a skew of internal signals which causes shortage of potential in the circuit is reduced to a minimum.

Furthermore, the booster circuit comprises a small number of electric elements such as transistors, capacitors, etc., so that a complicated control operation is not required as is in the conventional booster circuits shown above.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A booster circuit, comprising:

means for generating a first control signal, the first control signal selectively having first and second levels, the first level being higher by a predetermined value than a potential of a power supply and the second level being a level not exceeding the potential of said power supply;

a first n-MOS transistor which is connected at a gate to an output terminal of said generating means by which the gate is supplied with the first control signal, at one channel terminal to a power supply, and at the other channel terminal to a first connecting point;

a p-MOS transistor which is connected at a gate to an input terminal which is supplied with an input signal, at one channel terminal to the first connecting point, and at the other channel terminal to an output terminal by which an output signal of said booster circuit is supplied to an external circuit;

a second n-MOS transistor which is connected at a gate to the input terminal, at one channel terminal to the output terminal, and at the other channel terminal to ground; and a capacitor which is connected at one terminal to the first connecting point and at the other terminal to a control terminal by which said capacitor is supplied with a second control signal;

wherein said p-MOS transistor is formed on a surface of an n-type well region in which no other p-MOS transistor is formed, a potential of the n-type well being controlled to have the same level as that of the first connecting point; and said generating means being controlled to generate the first signal of the first level in a normal state, and of the second level in a predetermined period including at least a duration during which the second control signal is high.

2. A booster circuit, according to claim 1, wherein:

the first level of the first control signal is higher by a threshold voltage of said p-MOS transistor than a potential of the power supply sand the second level is equal to the potential of the power supply.

3. A booster circuit for use with a power supply, comprising:

means for generating a first control signal, the first control signal having first and second levels where the first level is higher by a predetermined value than a potential of a power supply, and the second level is does not exceed the potential of the power supply;

a first n-MOS transistor connected at a gate to an output terminal of said generating means, at one channel terminal to a power supply, and at the other channel terminal to a first connecting point;

a p-MOS transistor connected at a gate to an input terminal which is supplied with an input signal, at one channel terminal to the first connecting point, and at the other channel terminal to an output terminal by which an output signal is supplied to an external circuit;

a second n-MOS transistor connected at a gate to the input terminal, at one channel terminal to the output terminal, and at the other channel terminal to ground; and a capacitor connected at one terminal to the first connecting point and at the other terminal to a control terminal which supplies said capacitor with a second control.

* * * * *